US012782403B2

(12) United States Patent
Cook, III et al.

(10) Patent No.: US 12,782,403 B2

(45) Date of Patent: Nov. 3, 2026

(54) UTILITY METER SOCKET INTRUSION DETECTION (SYSTEMS AND METHODS)

(71) Applicant: THE SOUTHERN COMPANY, Atlanta, GA (US)

(72) Inventors: Charlie Thomas Cook, III, Jasper, AL (US); Brandon Keith Lundy, Hoover, AL (US)

(73) Assignee: The Southern Company, Atlanta, GA (US)

(*) Notice: Subject to any disclaimer, the term of this patent is extended or adjusted under 35 U.S.C. 154(b) by 162 days.

(21) Appl. No.: 18/416,214

(22) Filed: Jan. 18, 2024

(65) Prior Publication Data

US 2025/0237684 A1 Jul. 24, 2025

(51) Int. Cl.
*G01R 22/06* (2006.01)

(52) U.S. Cl.
CPC .................................. *G01R 22/066* (2013.01)

(58) Field of Classification Search
CPC ......... G01R 11/02; G01R 11/04; G01R 11/24; G01R 22/00; G01R 22/06–068
See application file for complete search history.

(56) References Cited

U.S. PATENT DOCUMENTS

| | | | | | |
|---|---|---|---|---|---|
| 4,707,679 | A * | 11/1987 | Kennon | G01F 15/007 | 902/1 |
| 5,056,107 | A * | 10/1991 | Johnson | H04W 74/08 | 375/138 |
| 5,523,559 | A * | 6/1996 | Swanson | G01R 22/066 | 340/568.4 |
| 2009/0210197 | A1* | 8/2009 | Cleary | G01F 15/0755 | 702/187 |
| 2009/0243866 | A1* | 10/2009 | Murphy | G06Q 50/06 | 340/637 |
| 2013/0057408 | A1* | 3/2013 | Aiken | H02H 1/0023 | 702/58 |
| 2013/0088353 | A1* | 4/2013 | LaFrance | G01R 11/24 | 340/551 |
| 2015/0260759 | A1* | 9/2015 | Ramirez | G06Q 50/06 | 340/870.09 |
| 2019/0120885 | A1* | 4/2019 | Kraus | G01R 22/066 | |
| 2021/0248898 | A1* | 8/2021 | McDougall, Jr. | G08B 29/046 | |

FOREIGN PATENT DOCUMENTS

| | | | | |
|---|---|---|---|---|
| EP | 2246667 | A1 * | 11/2010 | G01D 4/002 |

* cited by examiner

*Primary Examiner* — Huy Q Phan
*Assistant Examiner* — David B Frederiksen
(74) *Attorney, Agent, or Firm* — Troutman Pepper Locke LLP; Dustin B. Weeks

(57) ABSTRACT

An exemplary embodiment of the present disclosure provides an electric utility meter tampering detection system, comprising an electric utility meter housing, an electric utility meter located in the housing, and a sensor disposed in the housing. The sensor can be configured to detect the presence of light entering the housing from an area external to the housing.

17 Claims, 2 Drawing Sheets

UTILITY METER SOCKET INTRUSION DETECTION (SYSTEMS AND METHODS)

FIELD OF THE DISCLOSURE

The various embodiments of the present disclosure relate generally to electric utility meter instruction detection systems and methods.

BACKGROUND

Electric utility meter housing intrusion poses a significant challenge for electric utilities to detect. This practice typically aims to bypass metering systems, underreport consumption, or alter readings to reduce electricity bills. Service manipulation not only results in financial losses for utilities but also undermines fairness of billing processes and creates safety hazards for the general public. To combat socket wiring manipulation, utilities employ various strategies, including advanced metering technologies, intrusion-evident seals, periodic inspections guided by data analytics to detect suspicious patterns. Additionally, legal measures and penalties are enforced to deter individuals from engaging in this illegal activity and to protect the stability and sustainability of the electricity distribution system.

Many conventional detection systems primarily rely on basic threshold-based algorithms or electronic detection of a meter being removed from the meter socket or meter losing power. Current diversion techniques, however, often involve dismantling the meter housing without removing the meter from the meter socket, making these conventional techniques ineffective. As techniques evolve, there is a growing need for more advanced, intelligent systems that leverage additional sensors in the meter.

BRIEF SUMMARY

An exemplary embodiment of the present disclosure provides an electric utility meter tampering detection system, comprising an electric utility meter housing, an electric utility meter located in the housing, and a sensor disposed in the housing. The sensor can be configured to detect the presence of light entering the housing from an area external to the housing.

In any of the embodiments disclosed herein, the sensor can be disposed between the electric utility meter and a meter socket.

In any of the embodiments disclosed herein, the system may not contain an internal light source configured to direct light to the sensor.

In any of the embodiments disclosed herein, the sensor can be a photosensor configured to detect a level of light.

In any of the embodiments disclosed herein, the system can further comprise a controller configured to receive a signal from the sensor indicative of the level of light. The controller can be further configured to generate an alert when the level of light is above a predetermined threshold.

In any of the embodiments disclosed herein, the system can further comprise a controller configured to receive a signal from the sensor indicative of a level of light detected by the sensor and generate an alert if the indicated level of light is above a predetermined threshold.

In any of the embodiments disclosed herein, the predetermined threshold can be based, at least in part, on a current time of day.

In any of the embodiments disclosed herein, the predetermined threshold can be based, at least in part, on a current date.

In any of the embodiments disclosed herein, the alert can be indicative of electric arcing in the utility meter housing.

In any of the embodiments disclosed herein, the alert can be indicative of meter tampering.

Another embodiment of the present disclosure provides a method of detecting electric utility meter tampering, comprising: measuring, with a sensor, a level of light in an electric utility meter housing; and generating an alert if the level of light is above a predetermined threshold.

In any of the embodiments disclosed herein, the method can further comprise transmitting a signal to a remote computer, the signal indicative of the level of light measured in the housing.

In any of the embodiments disclosed herein, the remote computer can generate the alert.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

DETAILED DESCRIPTION

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

Figure 1:
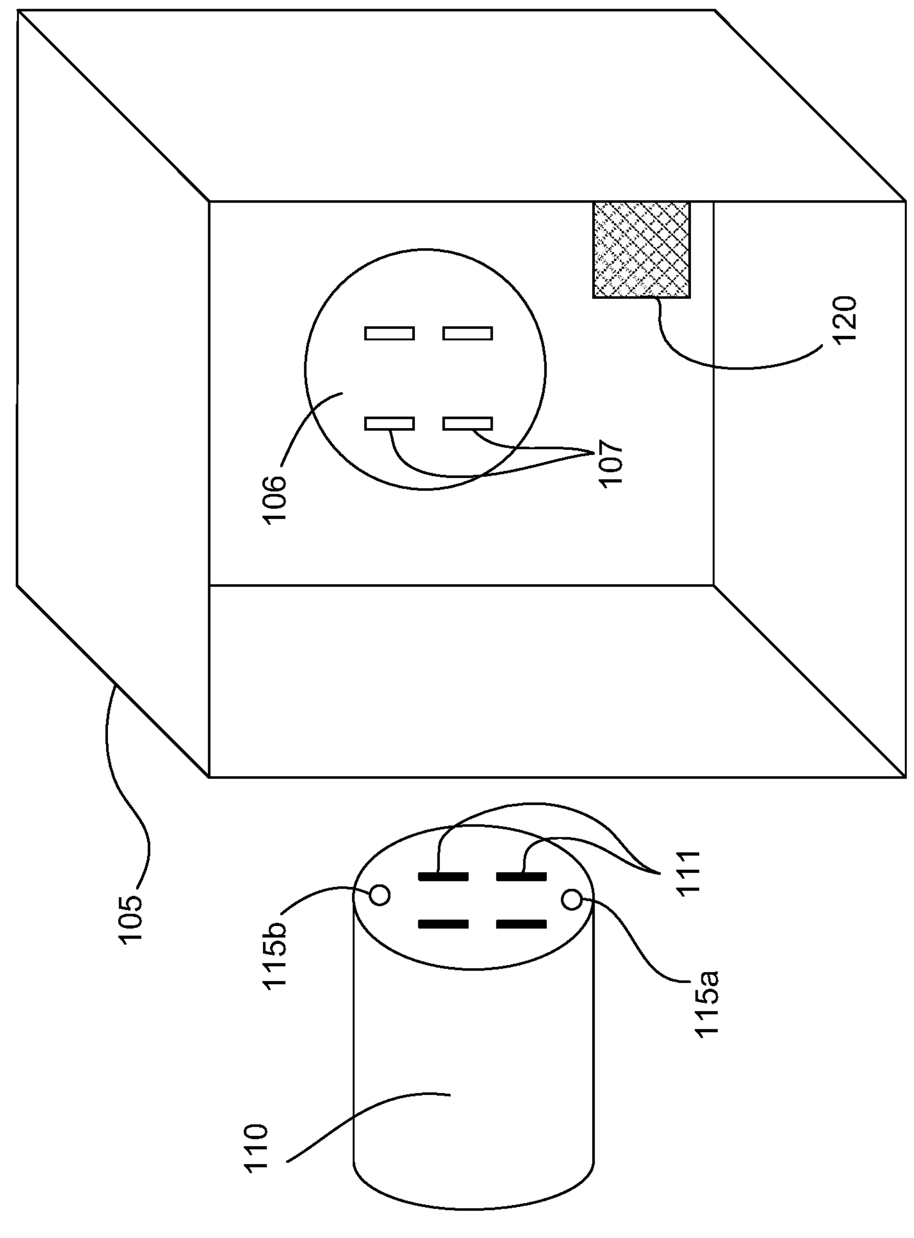
FIG. 1 provides a schematic of electric utility meter tampering detection system, in accordance with some embodiments of the present disclosure.

As shown in FIG. 1, an exemplary embodiment of the present disclosure provides an electric utility meter tampering detection system. The system can comprise an electric utility meter housing 105. The housing 105 can be any electric meter utility housing known in the art. The housing 105 can have outer walls defining an interior volume. Though not shown in FIG. 1, the housing can also have a door enclosing the interior volume. The outer walls can substantially inhibit light external to the housing 105 from entering the interior volume of the housing 105. The housing 105 can be made of many different materials, including, but not limited to, metals.

The housing 105 can house an electric utility meter 110 in the interior volume. For example, the housing can include a socket 106 configured to receive the meter 110. For purposes of illustration, in FIG. 1, the meter 110 is shown dislocated from the socket 106. The socket 106 can comprise one or more terminals 107 configured to interface with corresponding terminals 111 of the meter 110 such that the meter 110 can monitor and measure various parameters of the electrical current flowing through the terminals 107.

The system can further comprise one or more sensors 115*a* 115*b* disposed in the housing 105. The sensors 115*a* 115*b* can be configured to detect the presence of light entering the housing 105 from an area external to the interior volume of the housing 105. The sensors 115*a* 115*b* can be many different sensors known in the art for sensing and/or measuring a level of light, including, but not limited to, a photosensor, a photodiode, and the like.

The one or more sensors 115*a* 115*b* can be disposed at many different locations within the housing 105 in accordance with various embodiments of the present disclosure. In some embodiments, as shown in FIG. 1, the sensors 115*a* 115*b* can be disposed between the electric utility meter 110 and the meter socket 106, e.g. on the face of the meter/socket that abuts the face of the socket/meter. In some embodiments, the sensors 115*a* 115*b* can be disposed on an inner wall of the housing 105. Thus, if the housing 105 is tampered with to access the terminals of the socket (which can be used to obtain electrical power), e.g., the door (not shown) to the housing 105 is opened, even if the meter 110 is not removed from the socket 106, the sensors 115*a* 115*b* can detect the present of light entering the housing 105 from external to the housing 105.

In any of the embodiments disclosed herein, the system may not contain an internal light source configured to direct light to the sensor (e.g, a LED). This can help ensure that light detected by the sensors 115*a* 115*b* is indicative of tampering and/or arcing (i.e., abnormal operation), as opposed to routine operation of the meter 110.

In any of the embodiments disclosed herein, the system can further comprise a controller 120 configured to receive a signal from the sensor 115*s* and/or 115*b* indicative of the level of light. The controller 120 can be further configured to generate an alert when the level of light is above a predetermined threshold. In some embodiments, the predetermined threshold can be relative to a previously measured level of light. For example, in some embodiments, the controller 120 can detect changes in the level of light and generate an alert when the change in the level of light is above the predetermined threshold.

The controller 120 can be many controllers known in the art, including, but not limited to, microcontrollers, microprocessors, computing devices, and the like. In some embodiments, as shown in FIG. 1, the controller 120 can proximate the housing 105, e.g., in the housing 105. In some embodiments, the controller 120 can be located at a remote location (e.g., a server). The controller 120 can be configured to receive a signal, e.g., from the sensor 115*a* 115*b*, indicative of a level of light detected by the sensor 115*a* 115*b*. In some embodiments, the controller 120 can be configured to generate an alert if the indicated level of light is above a predetermined threshold.

In some embodiments, the predetermined threshold can be dependent on one or more parameters that affect the level of light that may be expected external to the housing 105, including, but not limited to, a current time of day, a current date, sunrise and sunset data, and/or the like. For example, the predetermined threshold may be lower at 3:00 AM than at 3:00 PM because it would be expected that the level of light naturally present outside the housing at 3:00 AM would be lower than at 3:00 PM.

In some embodiments, the controller can also monitor the length of time that the present of light is detected (including, e.g., a length of time that the level of light increases as compared to a prior measurement) to determine if an alert should be generated.

As discussed above, the system can be useful for detecting when the meter housing 105 has been tampered with to access the terminals 107, even when the meter 110 is not removed from the socket 106. For example, if the meter housing 110 is opened to access the terminals 107, light from the environment outside the housing 105, e.g. sunlight of light from a flashlight, will illuminate the sensor 115*a* 115*b*. In response, the sensor 115*a* 115*b* can generate an alert indicative of meter tampering.

In some embodiments, one or more sensors 115*a* 115*b* can also determine wavelength(s) of light incident on the sensors 115*a* 115*b*, which can be used to determine whether tampering has occurred. For example, the wavelength(s) incident on the sensor 115*a* 115*b* can be used to determine whether light from a non-natural light source is present within the housing 105 (e.g., red, blue, or green flashlight, torch, candle, LED, incandescent lamp, etc.).

The system can also be used to generate an alert indicative of electric arcing in the utility meter housing 105. For example, the electric arcing, e.g., between terminals 107, or a terminal 107 and another conductor, can generate light that is not normally present in the housing 105. This light can be detected by the sensors 115*a* 115*b* and analyzed to determine that the light may be associated with arcing (for example by analyzing the level and/or duration of the light). To determine if arcing is present, in some embodiments, the controller 120 can also monitor temperature from sensors (not shown) within the housing and/or voltage/current data provided by the utility meter.

The present disclosure is not limited to the use of any number of sensors. Rather, one or more sensors can be used to measure light and/or temperature, in accordance with various embodiments of the present disclosure. For example, in some embodiments, as shown in FIG. 1, a first sensor 115*a* can be disposed in a first location within the housing 105 (when the meter 110 is positioned in the socket 106), and a second sensor 115*b* can be disposed at a second location within the housing 105. In some embodiments, as shown in FIG. 1, the first sensor 115*a* and the second sensor 115*b* can be positioned between the meter 110 and the socket 106. In some embodiments, however, the sensors 115*a* 115*b* can be placed at other locations within the housing 105.

In some embodiments, the sensors 115*a* 115*b* (or another sensor) can further measure a temperature within the housing 105. The temperature inside the housing 105 can also be indicative of a tampering and/or arcing. For example, a sudden temperature change can be indicative that the housing 105 was opened and exposed to air from the external environment. Similarly, arcing can generate additional heat inside the housing 105.

Figure 2:
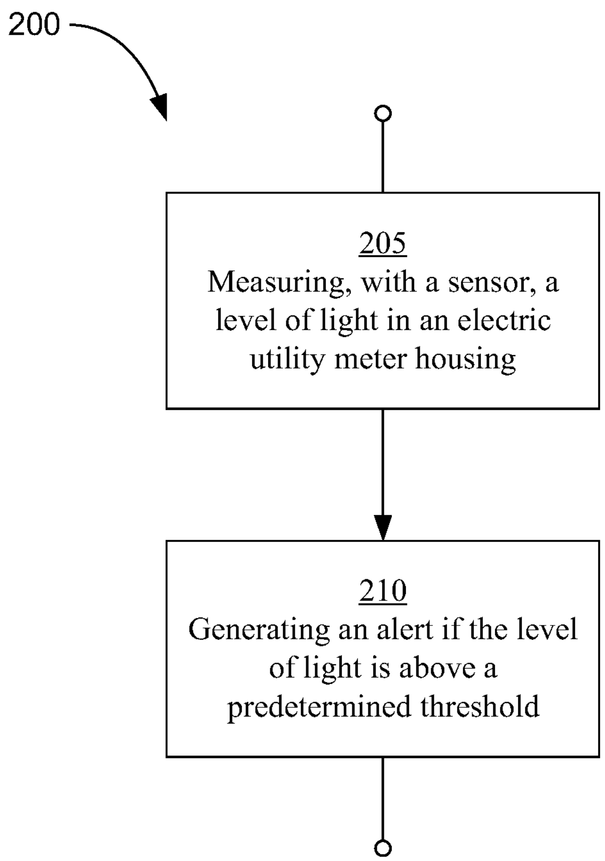
FIG. 2 provides flow chart of a method of detecting electric utility meter tampering, in accordance with some embodiments of the present disclosure.

In addition to tamper detection systems, some embodiments of the present disclosure provides methods of detecting electric utility meter tampering. As shown in FIG. 2, and exemplary embodiment of the present disclosure provides a method of detecting electric utility meter tampering 200, comprising: measuring, with a sensor, a level of light in an electric utility meter housing 205; and generating an alert if the level of light is above a predetermined threshold 210.

In some embodiments, the method can further comprise transmitting a signal to a remote computer (e.g., server or remotely located controller). The signal transmitted to the remote computer can be indicative of the level of light measured in the housing. The signal can be transferred many different ways known in the art, including but not limited to wireless transmission and wired transmission. Once the signal is received by the remote computer, the remote computer can process the signal (e.g., determine if it is above a predetermined threshold) and generate the alert.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. An electric utility meter tampering detection system, comprising:

an electric utility meter housing;

an electric utility meter located in the electric utility meter housing;

a sensor disposed in the electric utility meter housing between the electric utility meter and a meter socket, the sensor configured to detect a presence of light entering the electric utility meter housing from an area external to the electric utility meter housing; and a controller configured to receive a signal from the sensor indicative of a level of light detected by the sensor and generate an alert if the indicated level of light is above a predetermined threshold, wherein the predetermined threshold is based, at least in part, on one or more parameters that affect a level of light that is expected external to the electric utility meter housing.

2. The electric utility meter tampering detection system of claim 1, wherein the system does not contain an internal light source configured to direct light to the sensor.

3. The electric utility meter tampering detection system of claim 1, wherein the sensor is a photosensor configured to detect a level of light.

4. The electric utility meter tampering detection system of claim 3, further comprising a controller configured to receive a signal from the sensor indicative of the level of light, the controller further configured to generate an alert when the level of light is above a predetermined threshold.

5. The electric utility meter tampering detection system of claim 1, wherein one or more parameters include a current time of day.

6. The electric utility meter tampering detection system of claim 1, wherein the one or more parameters include a current date.

7. The electric utility meter tampering detection system of claim 1, wherein the alert is indicative of electric arcing in the utility meter housing.

8. The electric utility meter tampering detection system of claim 1, wherein the alert is indicative of meter tampering.

9. A method of detecting electric utility meter tampering, comprising:

measuring, with a sensor disposed between the electric utility meter and a meter socket, a level of light in an electric utility meter housing; and generating an alert if the level of light is above a predetermined threshold, wherein the predetermined threshold is based, at least in part, on one or more parameters that affect a level of light that is expected external to the electric utility meter housing.

10. The method of claim 9, wherein the electric utility meter housing does not contain an internal light source configured to direct light to the sensor.

11. The method of claim 9, wherein the sensor is a photosensor configured to measure the level of light.

12. The method of claim 9, further comprising transmitting a signal to a remote computer, the signal indicative of the level of light measured in the electric utility meter housing.

13. The method of claim 12, wherein the remote computer generates the alert.

14. The method of claim 9, wherein the predetermined threshold is based, at least in part, on a current date.

15. The method of claim 9, wherein the alert is indicative of electric arcing in the electric utility meter housing.

16. The method of claim 9, wherein the alert is indicative of meter tampering.

17. A method of detecting electric utility meter tampering, comprising: measuring, with a sensor disposed between the electric utility meter and a meter socket, a level of light in an electric utility meter housing; and generating an alert if the level of light is above a predetermined threshold, wherein the predetermined threshold is based, at least in part, on a current time of day.

* * * * *